(12) United States Patent
Surthi

(10) Patent No.: US 8,603,891 B2
(45) Date of Patent: Dec. 10, 2013

(54) METHODS FOR FORMING VERTICAL MEMORY DEVICES AND APPARATUSES

(75) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 13/354,982

(22) Filed: Jan. 20, 2012

(65) Prior Publication Data

US 2013/0187220 A1    Jul. 25, 2013

(51) Int. Cl.
  *H01L 21/76* (2006.01)
(52) U.S. Cl.
  USPC ........... 438/424; 438/212; 438/259; 257/329; 257/E21.546; 257/E29.262
(58) Field of Classification Search
  USPC .......... 438/212, 259, 424; 257/329, E21.546, 257/E29.262
  See application file for complete search history.

(56) References Cited

U.S. PATENT DOCUMENTS

| | | | |
|---|---|---|---|
| 6,617,213 B2 | 9/2003 | Hummler | |
| 7,084,457 B2 * | 8/2006 | Hsieh et al. | 257/329 |
| 7,541,240 B2 | 6/2009 | Pham et al. | |
| 7,582,921 B2 | 9/2009 | Sekiguchi et al. | |
| 7,601,591 B2 | 10/2009 | Hwang et al. | |
| 2001/0001720 A1* | 5/2001 | Clampitt et al. | 438/257 |
| 2005/0173748 A1* | 8/2005 | Seitz et al. | 257/301 |
| 2007/0212849 A1 | 9/2007 | Ludwig et al. | |

* cited by examiner

*Primary Examiner* — Andy Huynh
(74) *Attorney, Agent, or Firm* — TraskBritt

(57) ABSTRACT

Methods of forming vertical memory devices include forming first trenches, at least partially filling the first trenches with a polysilicon material, and forming second trenches generally perpendicular to the first trenches. The second trenches may be formed by removing one of silicon and oxide with a first material removal act and by removing the other of silicon and oxide in a different second material removal act. Methods of forming an apparatus include forming isolation trenches, at least partially filling the isolation trenches with a polysilicon material, and forming word line trenches generally perpendicular to the isolation trenches, the word line trenches having a depth in a word line end region about equal to or greater than a depth thereof in an array region. Word lines may be formed in the word line trenches. Semiconductor devices, vertical memory devices, and apparatuses are formed by such methods.

14 Claims, 9 Drawing Sheets

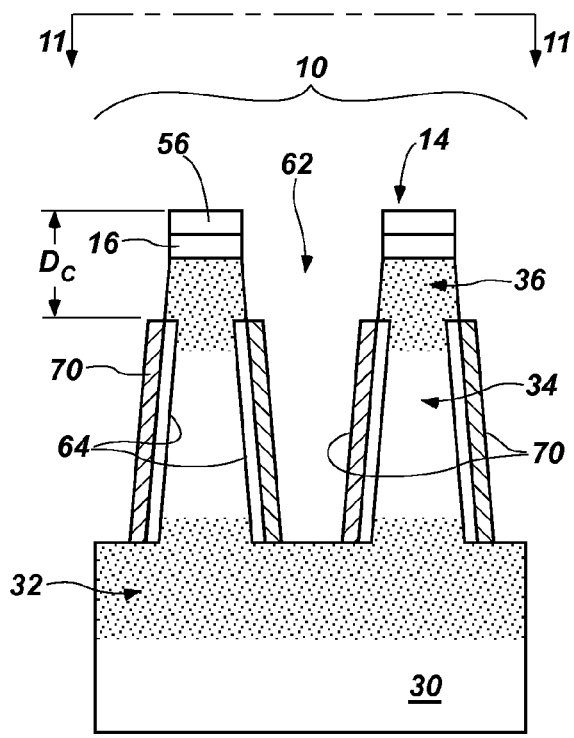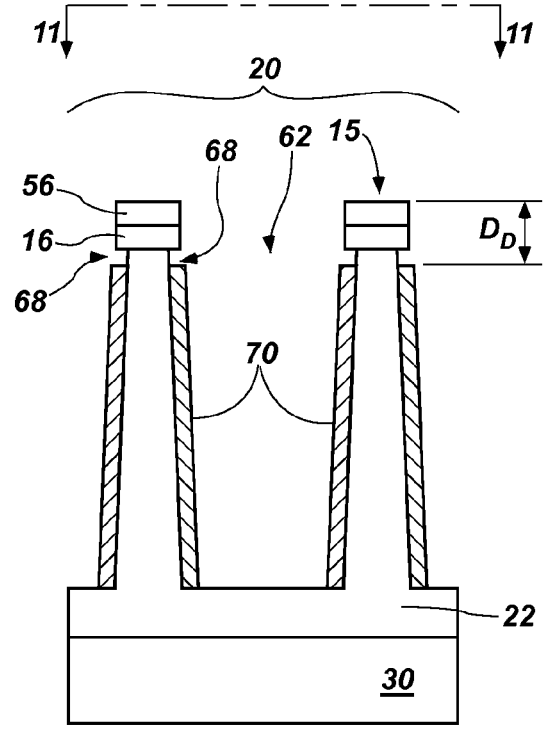
FIG. 12  FIG. 13
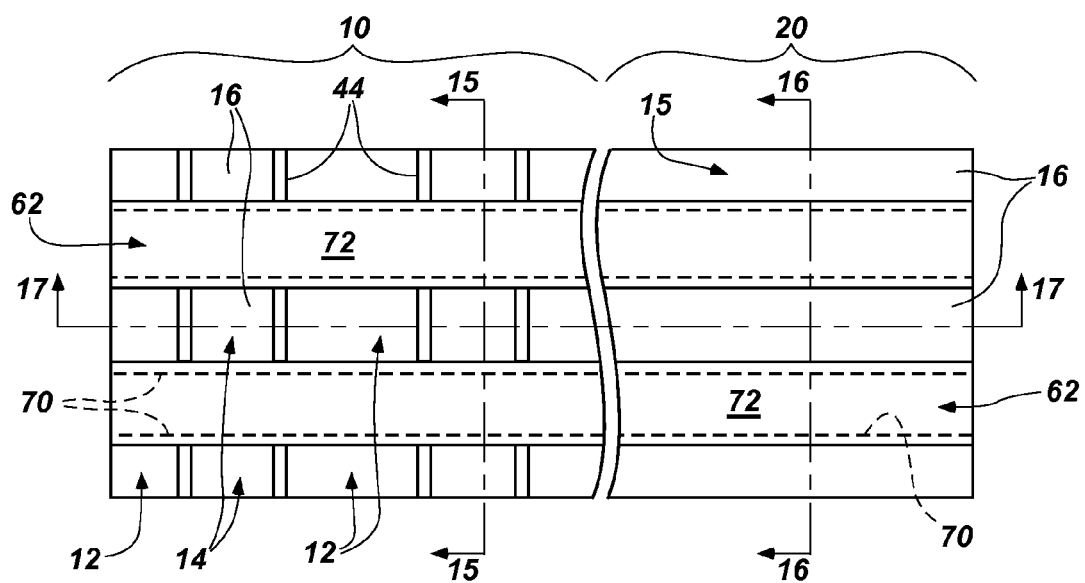
FIG. 14

METHODS FOR FORMING VERTICAL MEMORY DEVICES AND APPARATUSES

TECHNICAL FIELD

Embodiments of the present disclosure relate to vertical memory devices and apparatuses including vertical memory devices. More specifically, embodiments are directed to vertical memory devices and apparatuses including a word line formed on sidewalls of a trench and to a method of making such vertical memory devices.

BACKGROUND

Increased demand for computer memory has driven the memory industry to introduce various configurations and designs of transistors to fit more memory into a given area and, therefore, to create memory devices with increased memory density. One such memory device with the potential for increased memory density is the so-called "vertical memory" device. A vertical memory device includes an array of transistors with each transistor in the form of a pillar extending generally perpendicular to a substrate, such as a silicon substrate. Each transistor of the vertical memory device includes a silicon pillar having several doped regions. For example, a bottom region may be n-doped, a middle region may be p-doped, and a top region may be n-doped. The bottom, n-doped region may be a source region and the top, n-doped region may be a drain region. The bottom, n-doped region may extend in a first direction parallel to the substrate across multiple pillars to form a data/sense line, e.g., a bit line, for reading and writing data to the transistors. A gate material, such as a gate oxide, may be formed along a vertical sidewall of the pillar to cover the middle, p-doped region and to contact a portion of the top and bottom n-doped regions, respectively. An access line, e.g., a word line, for reading and writing data to the transistors may be formed over the gate material along the vertical sidewall of the pillar and may extend across multiple transistors in a second direction that is generally perpendicular to the first direction.

Bit lines of pillars adjacent to each other in the second direction may be separated by a trench extending in the first direction. Word lines on pillars adjacent to each other in the first direction may be separated by another trench that extends in the second direction. Such trenches may generally be filled with a dielectric, i.e., non-conductive, material, such as silicon oxide, silicon nitride, air, etc., for providing electrical isolation between adjacent bit lines and word lines, respectively.

A word line end region may be located proximate the edge of the array. Conventionally, the word line end region includes an oxide material in the form of columns, with the ends of the word lines formed along sidewalls of the oxide columns. The oxide in the word line end region may be a high quality oxide, such as a spin-on dielectric ("SOD"), which is annealed. The array may include the silicon of the pillars and another oxide material, such as an oxide formed from tetraethylorthosilicate ("TEOS") and SOD, disposed in the trenches extending in the first direction. The oxide material in the array may be of relatively lower quality than the oxide in the word line end region. To form the conductive word lines, the trenches extending in the second direction, i.e., the word line trenches, are partially filled with conductive material to form the word lines. These word line trenches are conventionally formed by dry etching the silicon of the pillars in the array region, the oxide material in the array region, and the oxide material in the word line end region in a single etching act employing a particular chemistry. However, the silicon material and oxide material typically exhibit different etch rates when subjected to the same chemistry. In addition, a single anisotropic removal process generally forms sloped sidewalls in silicon material having an angle closer to vertical than an angle of sidewalls in oxide material. The difference in etch rates and in sidewall angles may result in uneven trench surfaces. The uneven trench surfaces may cause difficulties when forming the word line. The difference in etch rates may also cause the word line trench to be shallower in the word line end region than in the array region. The shallower depth of the word line trench in the word line end region may cause word lines formed in the word line trench to exhibit thinning or breaking. Furthermore, device performance may be negatively affected by word lines formed on the uneven trench surfaces. Cleaning the surfaces of the word line trench with aggressive cleaning agents in preparation for forming the gate oxide may aggravate these problems. However, less aggressive cleaning agents, such as water, are less effective at removing defects from surfaces of the word line trench and may leave defects that cause device failure.

BRIEF DESCRIPTION OF THE DRAWINGS

FIGS. 1 through 19 illustrate an embodiment of a method for forming an apparatus having sidewall word lines according to the present disclosure.

DETAILED DESCRIPTION

Figure 1:
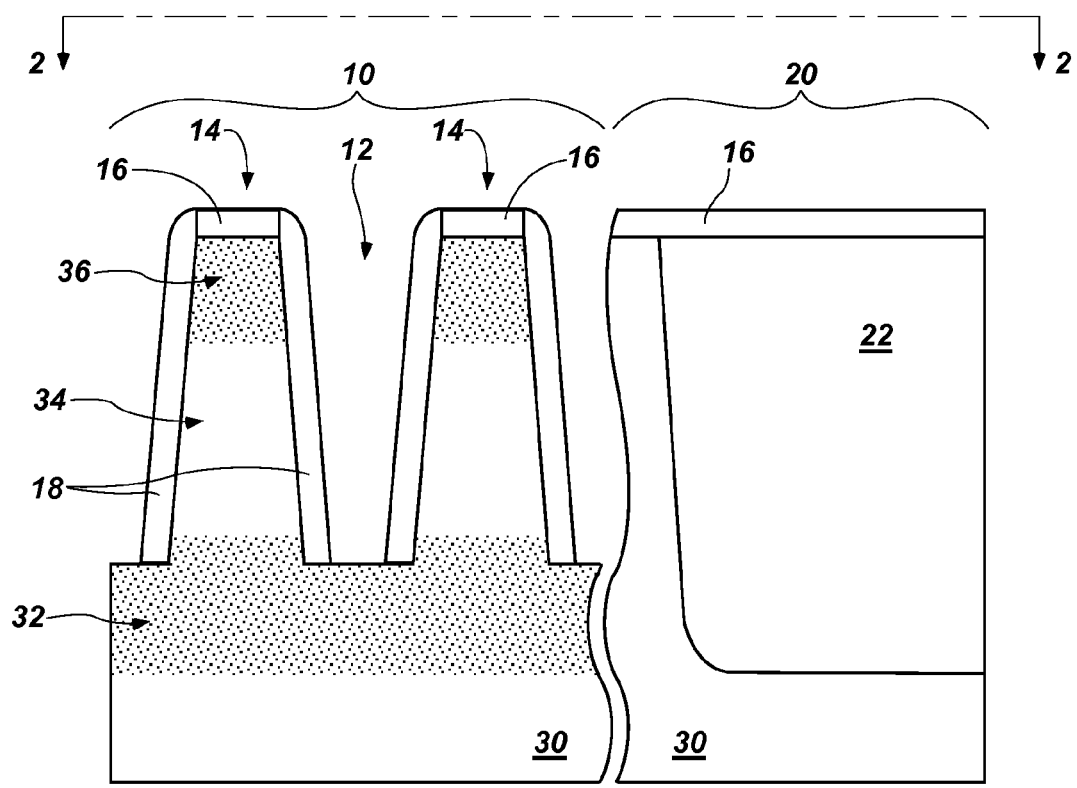

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the semiconductor industry.

The fabrication processes described herein do not describe a complete process flow for forming memory devices. The memory devices described below do not form a complete semiconductor device. The remainder of the process flow is known to those of ordinary skill in the art. Accordingly, only the methods and memory devices necessary to understand embodiments of the present disclosure are described in detail herein. Additional acts to form complete memory devices and systems may be performed by conventional fabrication techniques.

As used herein, any relational term, such as "first," "second," "over," "under," "top," "bottom," "underlying," "lower," "upper," "deeper than," etc., is used for clarity and convenience in understanding the disclosure and accompanying drawings and does not connote or depend on any specific preference, orientation, or order, except where the context clearly indicates otherwise.

As used herein, the terms "vertical" and "vertically" refer to a direction generally perpendicular to a major plane in which a substrate, such as a wafer, a microchip, etc., extends. The "vertical" direction is relative to the substrate and does not depend on any particular orientation or view of the substrate as a whole. For purposes of understanding the present disclosure, the "vertical" direction is up and down when viewed in the perspective of FIG. 1, for example.

As used herein, the terms "horizontal" and "horizontally" refer to a direction generally parallel to a major plane in which the substrate, such as a wafer, a microchip, etc., extends. The "horizontal" direction is relative to the substrate and does not depend on any particular orientation or view of the substrate as a whole. For purposes of understanding the present disclosure, a "horizontal" direction may be left and right or in and out of the page when viewed in the perspective of FIG. 1, for example.

As used herein, the term "apparatus" means and includes a device, such as a memory device, e.g., a so-called "vertical memory device," or a system that includes such a device.

As used herein, the term "substantially" in reference to a given parameter means and includes to a degree that one of ordinary skill in the art would understand that the given parameter, property, or condition is met with a degree of variance, such as within acceptable manufacturing tolerances.

As used herein, the term "forming" means and includes any method of creating, building, patterning, or depositing a feature or material. For example, forming may be accomplished by atomic layer deposition (ALD), chemical vapor deposition (CVD), physical vapor deposition (PVD), sputtering, co-sputtering, spin-coating, diffusing, depositing, growing, photolithography, dry etching, wet etching, or any other technique known in the art of semiconductor fabrication. Depending on the specific feature to be formed, the technique for forming the feature may be selected by a person of ordinary skill in the art.

In the following detailed description, reference is made to the accompanying drawings, which form a part of the present disclosure, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, compositional, and electrical changes may be made without departing from the scope of the present disclosure. The illustrations presented herein are not meant to be actual views of any particular system, device, structure, or memory cell, but are merely idealized representations that are employed to describe the embodiments of the present disclosure. The drawings presented herein are not necessarily drawn to scale. Additionally, elements common between drawings may retain the same numerical designation.

The embodiments of the present disclosure include methods for forming an apparatus including word lines formed on trench sidewalls. For clarity and convenience, these word lines may be referred to herein as "sidewall word lines." The embodiments of the present disclosure also include memory arrays, devices, and apparatuses including word lines formed on sidewalls of trenches. Each of the word lines may extend horizontally in an array region and in a word line end region. Additionally, each of the word lines may extend vertically in the word line end region at a depth greater than or equal to the depth of the word line in the array region, as will be described in more detail below.

Embodiments of methods that may be used to form an apparatus having sidewall word lines, such as a vertical memory device, are described with reference to FIGS. 1 through 17. Embodiments of the present disclosure may be used in any type of memory device that includes word lines formed on generally vertical sidewalls, such as DRAM, CMOS, NAND, etc. FIGS. 1 through 17 illustrate a semiconductor device structure at different stages of the formation of the apparatus.

Figure 2:
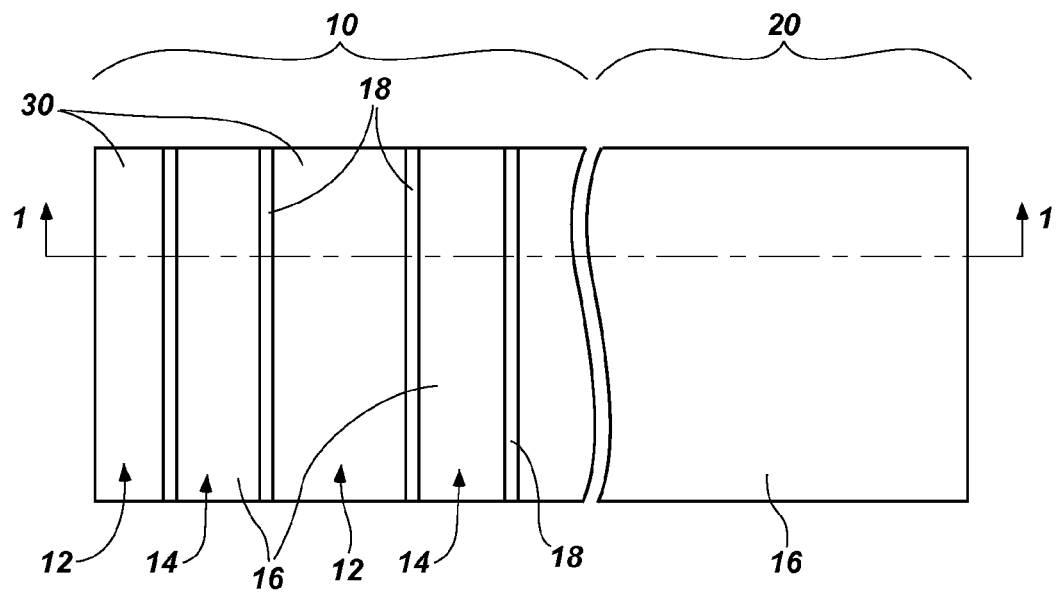

FIGS. 1 and 2 are different views of an array region 10 and a word line end region 20 of a semiconductor device structure from which an apparatus, such as a vertical memory device, may be formed. FIG. 1 is a cross-sectional side view of the semiconductor device structure taken along line 1-1 in FIG. 2. FIG. 2 is a top view of the semiconductor device structure taken along line 2-2 in FIG. 1.

The structure shown in the array region 10 includes a silicon substrate 30 with a plurality of doped regions 32, 34, and 36. The silicon substrate 30 in the array region 10 may be doped, such as p-doped, by conventional methods known in the art that are not described herein in detail. A first source/drain region 32, e.g., source region, of the silicon substrate 30 may be formed by doping the region with an n-type dopant, such as by conventional methods known in the art that are not described herein in detail. A mid-channel region 34 of the silicon substrate 30 may be a p-doped region of the silicon substrate 30. The mid-channel region 34 may simply be a portion of the bulk p-doped silicon substrate 30, or may be doped with additional p-type dopant, as is known in the art. A second source/drain region 36, e.g., drain region, of the silicon substrate 30 may be doped with an n-type dopant, such as by conventional methods known in the art that are not described herein in detail. Therefore, the first source/drain region 32, the mid-channel region 34, and the second source/drain region 36 are formed from the substrate 30 and may be referred to collectively as regions of the substrate 30. The silicon substrate 30, including the first source/drain region 32, the mid-channel region 34, and the second source/drain region 36, may include a substantially crystalline silicon material. Any of the regions 32, 34, and 36 may have a dopant concentration gradient across the region. For example, the first source/drain region 32 may include a lower portion that is heavily doped and an upper portion that is lightly doped relative to the lower portion. Such a dopant concentration gradient may reduce current leakage during operation of a semiconductor device that includes the first source/drain region 32.

In the configuration described above with reference to FIG. 1, the regions 32, 34, and 36 may be used to form a vertical NPN transistor. However, the present disclosure is not limited to configurations including NPN transistors. The doping of the regions 32, 34, and 36 may be reversed, such that the first source/drain region 32 is p-doped, the mid-channel region 34 is n-doped, and the second source/drain region 36 is p-doped to form a vertical PNP transistor. Thus, the present disclosure is not limited to the particular doping scheme described above with reference to FIG. 1.

A portion of the silicon substrate 30 may be removed, i.e., etched, through a first mask 16 formed and patterned by, for example, photolithography, to form a plurality of columns 14 separated by a plurality of first trenches 12. By way of example, material of the silicon substrate 30 may be removed to form the first trenches 12 by an anisotropic dry etch act. The first mask 16 may include, for example, a nitride material, e.g., SiN, or other suitable material known in the art. Optionally, an oxide material (not shown), such as $SiO_2$, may be formed over the silicon substrate 30 prior to formation of the first mask 16. Thus, in some embodiments, an oxide material may be disposed between the substrate 30 of the columns 14 and the first mask 16. The first trenches 12 may be formed to a depth sufficient to expose a portion of the first source/drain region 32. For example, in embodiments with a first source/ drain region 32 having a dopant concentration gradient, material from the substrate 30 may be removed to expose a lightly doped upper portion of the first source/drain region 32 at the bottom of the first trenches 12 while leaving a heavily doped lower portion thereof unexposed. The first trenches 12 may be defined by sidewalls of the silicon substrate 30, i.e., sidewalls of the columns 14. The sidewalls of the silicon substrate 30 defining the first trenches 12 may be generally vertical. In some embodiments, the sidewalls may be tapered, as shown in FIG. 1, such that the sidewalls do not extend exactly vertically. Such a taper may be caused by the process used to remove the material of the silicon substrate 30 to form the first trenches 12. Sidewall liners 18 may be formed on the sidewalls of the silicon substrate 30 defining the first trenches 12 by, for example, conformally depositing a liner material and anisotropically etching the liner material from horizontal surfaces, such as from surfaces at the bottom of the first trench 12 and surfaces at the top of the column 14. The material of the sidewall liners 18 may include, for example, an oxide material, e.g., $SiO_2$, a nitride material, e.g., SiN, or a combination thereof. The sidewall liners 18 may inhibit the material of the columns 14 from being removed during a subsequent material removal act, as will be described in more detail below with reference to FIG. 3.

Referring again to FIG. 1, the word line end region 20 may include an oxide material 22 for electrically isolating features to be subsequently formed in or on the word line end region 20. The oxide material 22 may be formed by any conventional method known in the art, such as, for example, by depositing a SOD material, by CVD, by diffusion, by ALD, etc. The oxide material 22 may be annealed to cure and improve the quality of the oxide material 22. The first mask 16 may substantially cover the word line end region 20 to inhibit removal of portions of the substrate 30 and oxide material 22 in the word line end region 20 during the formation of the first trenches 12, as described above.

Figure 3:
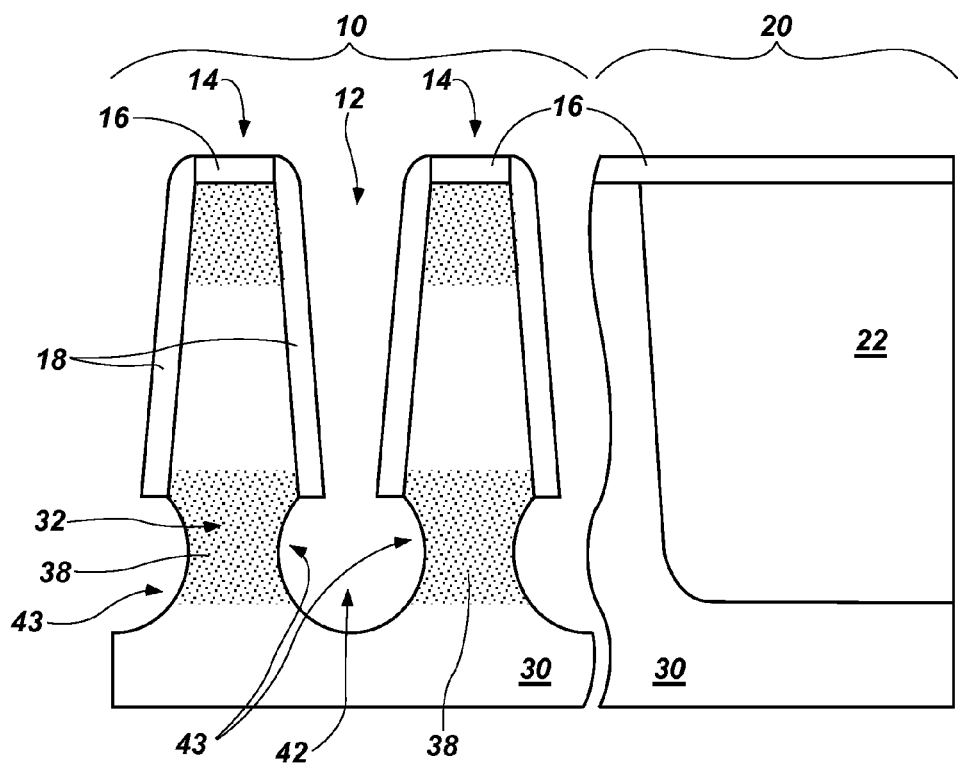

As shown in FIG. 3, an isolation trench 42 may be formed in the substrate 30 by extending the depth of the first trench 12 into the silicon substrate 30 to separate the first source/drain regions 32 of the silicon substrate 30, forming buried digit lines 38. Removal of material from the isolation trench 42 may occur by an etch, such as an isotropic dry etch, an isotropic wet etch, a combination of isotropic and anisotropic etches, etc., such that the silicon substrate 30 (including the first source/drain region 32) is recessed vertically and horizontally, i.e., to the left and right when viewed from the perspective of FIG. 3. The removal of the material may optionally form an undercut region 43 in the silicon substrate 30. The etchant may be chosen to selectively remove material of the silicon substrate 30 and, therefore, may not remove the first mask 16, the sidewall liners 18, or the material immediately underlying the first mask 16 and the sidewall liners 18. The isolation trench 42 may extend horizontally into the columns 14 to create a greater distance between adjacent buried digit lines 38 for improved electrical isolation of adjacent buried digit lines 38 when compared to a trench that does not extend horizontally into the columns 14. Optionally, in some embodiments, a conductive material (not shown), such as a metal, metal silicide, metal nitride, silicon-metal-on-insulator (SMOI) material, etc., may be formed in the undercut region 43, when present, and in contact with the first source/drain region 32.

Figure 4:
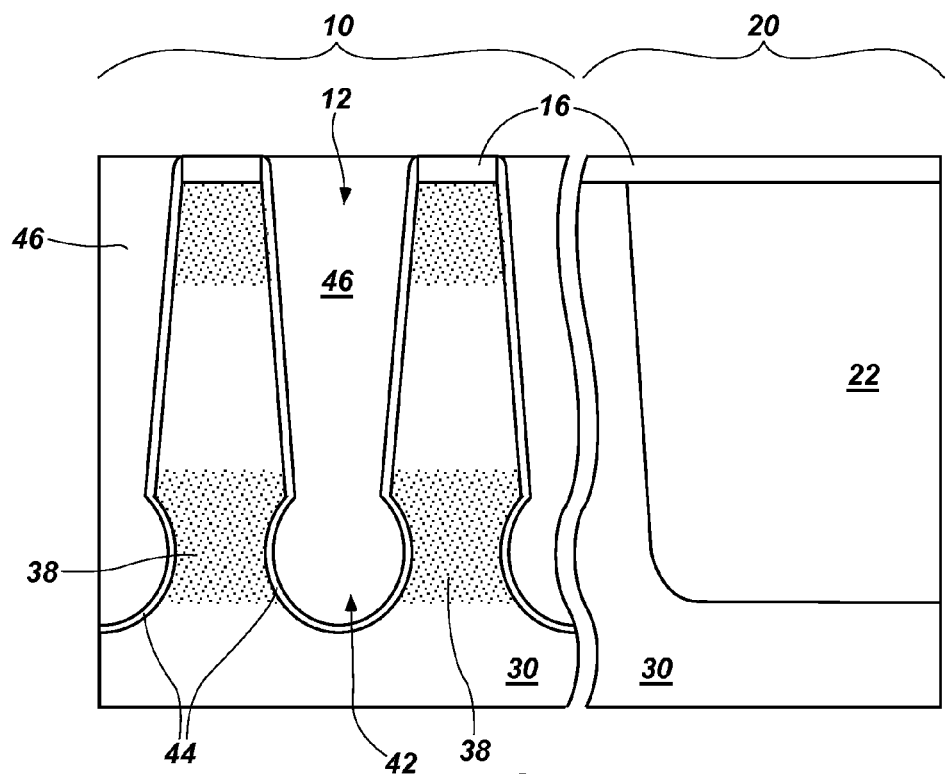

As can be seen in FIG. 4, the sidewall liners 18 may, optionally, be removed. A conformal liner 44 may be formed on sidewalls of the substrate 30 defining the first trench 12 and the isolation trench 42. The conformal liner 44 may be formed of a dielectric material and may include, for example, an oxide such as $SiO_2$, a nitride such as SiN, or a combination of oxide and nitride such as an oxynitride material. In one embodiment, the conformal liner 44 may be substantially formed of $SiO_2$. The conformal liner 44 may be subjected to heat treatment to improve the quality thereof, such as to improve an etch resistance thereof. The conformal liner 44 may be relatively thin compared to widths of the columns 14, the first trench 12, and the isolation trench 42. By way of example and not limitation, the conformal liner 44 may be formed to have a thickness between about 30 Å and about 50 Å. The conformal liner 44 may inhibit the removal of underlying material during subsequent material removal acts, which are described in more detail below.

After the conformal liner 44 is formed, the first trench 12 and the isolation trench 42 may be at least partially filled with a polysilicon, i.e., poly-crystalline silicon, material 46. By way of example, the first trench 12 and the isolation trench 42 may be filled with an amorphous silicon material that becomes a polysilicon material 46 after subsequent heating, such as from an anneal process or from a material formation process. Thus, the array region 10 may include the columns 14 of crystalline silicon material, the first trench 12 and the isolation trench 42 filled with the polysilicon material 46, and the conformal liner 44 of oxide and/or nitride separating the crystalline silicon material of the columns 14 and the polysilicon material 46.

After the polysilicon material 46 is formed in the first trenches 12, the semiconductor device structure may be planarized, for example by chemical mechanical planarization ("CMP"), among other known methods. The planarization may stop on the material of the first mask 16. After the planarization, the polysilicon material 46, the conformal liner 44, and the first mask 16 may have exposed surfaces along the top of the semiconductor device structure, when viewed in the perspective of FIG. 4, that are substantially co-planar.

Figure 5:
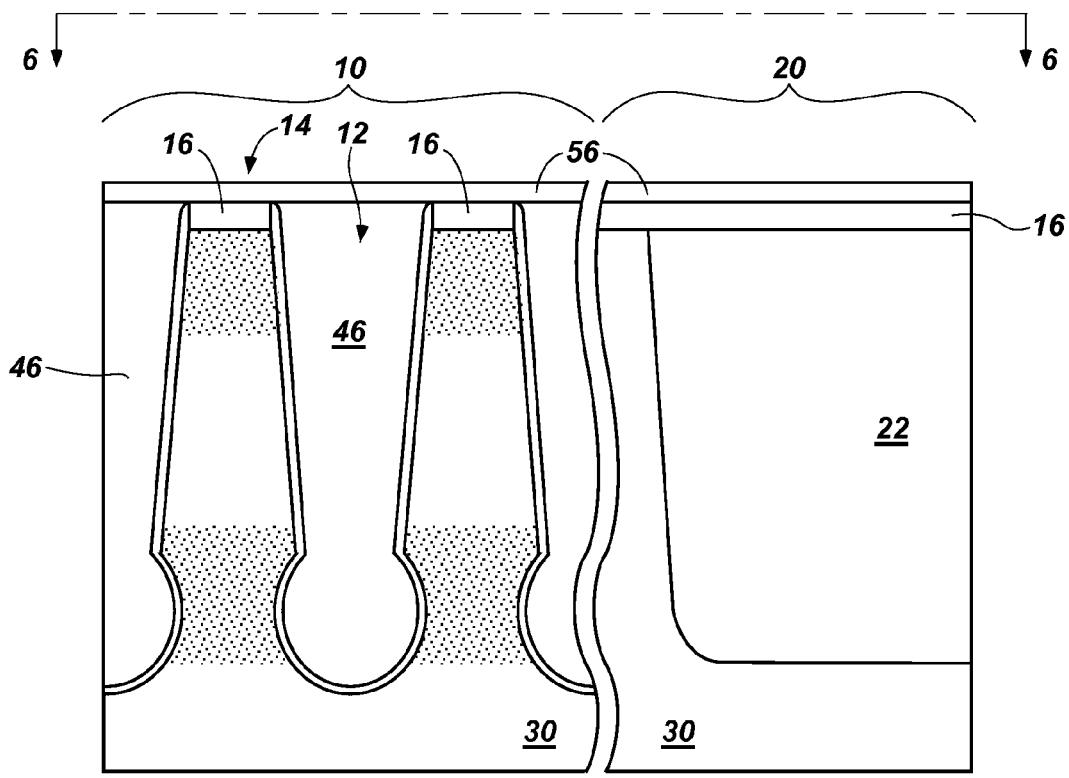
Figure 6:
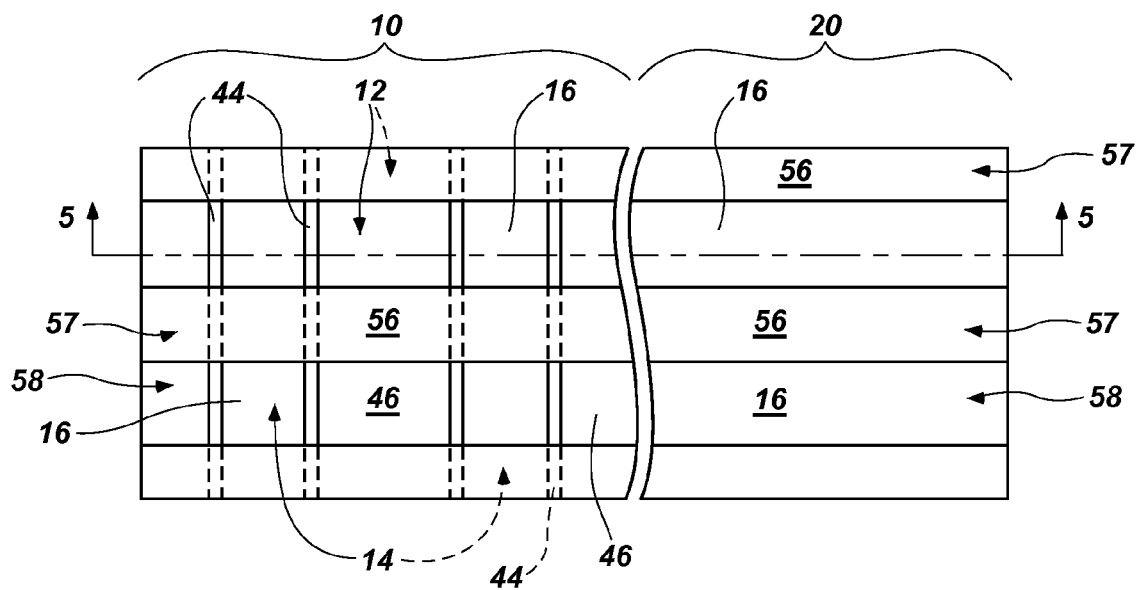

FIGS. 5 and 6 are different views of the semiconductor device structure after further processing. FIG. 6 is a top view of the semiconductor device structure taken along line 6-6 in FIG. 5. FIG. 5 is a cross-sectional side view of the semiconductor device structure taken along line 5-5 in FIG. 6.

As can be seen in FIGS. 5 and 6, a second mask 56 may be formed over the semiconductor device structure and patterned to form lines 57 in a direction substantially perpendicular to a direction of the first trenches 12. The lines 57 may be separated by elongated regions 58 with portions therein of exposed polysilicon material 46 in the first trenches 12, exposed first mask 16 over the columns 14, exposed conformal liner 44 between the first mask 16 and the polysilicon material 46, and exposed first mask 16 in the word line end region 20. Alternatively, the first mask 16 may be removed (not shown) prior to the formation of the second mask 56.

Figure 7:
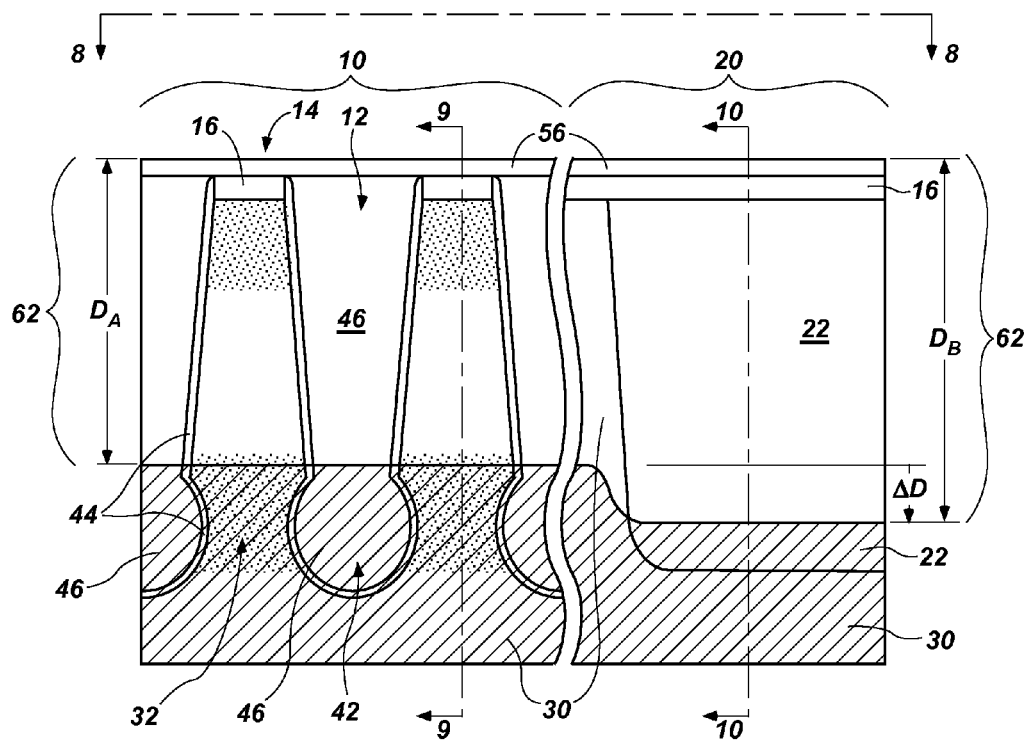
Figure 8:
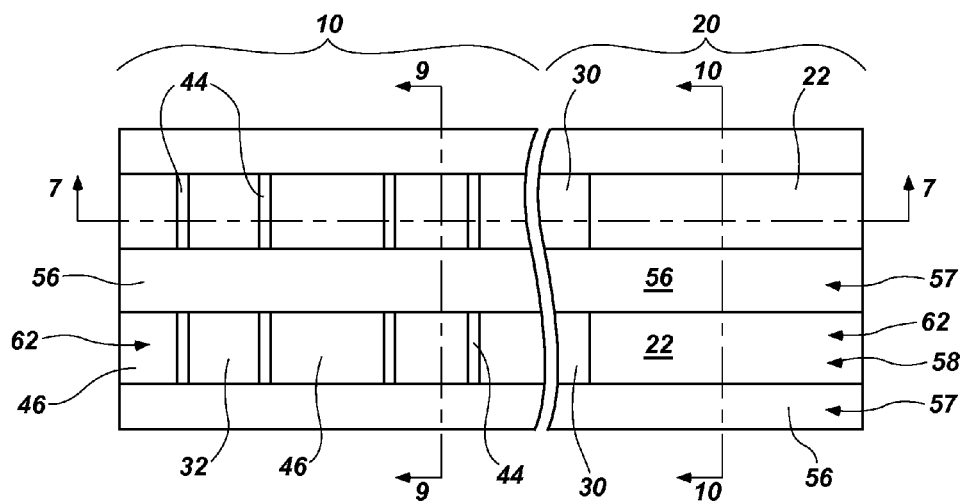
Figures 9, 10:
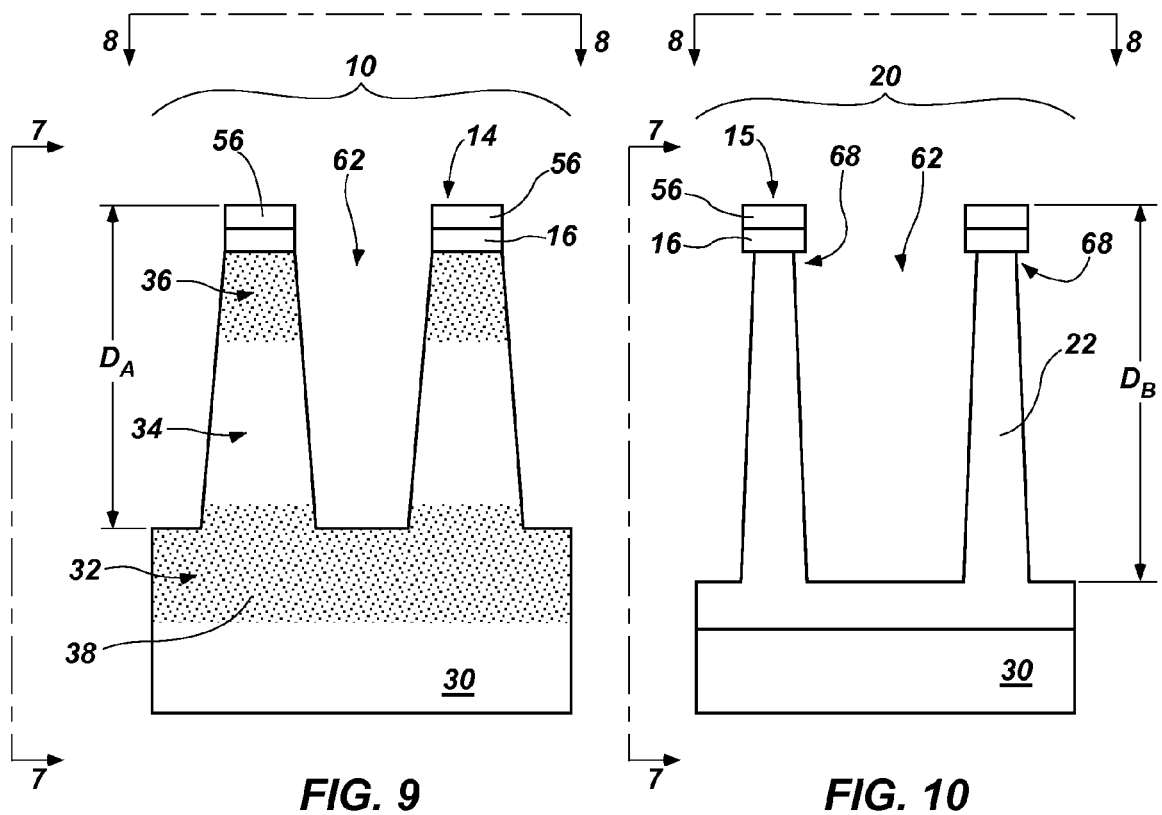

FIGS. 7 through 10 show different views of the semiconductor device structure after further processing. FIG. 8 is a top view of the semiconductor device structure taken along lines 8-8 in FIGS. 7, 9, and 10. FIG. 7 is a cross-sectional side view of the semiconductor device structure taken along lines 7-7 in FIGS. 8, 9, and 10. FIG. 9 is a cross-sectional side view of the semiconductor device structure in the array region 10 taken along lines 9-9 in FIGS. 7 and 8. FIG. 10 is a cross-sectional side view of the semiconductor device structure in the word line end region 20 taken along lines 10-10 in FIGS. 7 and 8.

As can be seen in FIGS. 7 through 10, material may be removed in the elongated regions 58 between the lines 57 to form a second trench 62 extending in a direction generally perpendicular to the direction that the first trench 12 extends, such as by one or more anisotropic dry etching acts. The lower portion of FIG. 7 is shown with cross-hatching to more clearly show the second trench 62 extending horizontally, i.e., to the left and right when viewed in the perspective of FIG. 7, in the non-cross-hatched upper portion of FIG. 7. Material may be removed to form the second trench 62 in both the array region 10 and the word line end region 20. As a result of the material removal process used to form the second trench 62, which is described in more detail below, the depth of the second trench 62 may be different in the array region 10 than in the word line end region 20. As shown in FIGS. 7 and 9, the second trench 62 may extend to a depth $D_A$ in the array region 10. As shown in FIGS. 7 and 10, the second trench 62 may extend to a depth $D_B$ in the word line end region 20, which may be about equal to or greater than the depth $D_A$ in the array region 10. The difference between the depth $D_B$ in the word line end region 20 and the depth $D_A$ in the array region 10 is indicated in FIG. 7 by the distance $\Delta D$. The depth $D_B$ of the second trench 62 in the word line end region 20 may be about equal to or greater than the depth $D_A$ of the second trench 62 in the array region 10. In other words, the distance $\Delta D$ between the depth $D_B$ and the depth $D_A$ may be about zero or greater than zero.

In the array region 10, a bottom surface of the second trench 62 may be defined at least in part by portions of the buried digit line 38 and exposed polysilicon material 46 in the first trench 12 and/or in the isolation trench 42. The buried digit line 38 and the polysilicon material 46 may be separated by the conformal liner 44. In the word line end region 20, the bottom of the second trench 62 may be defined at least in part by exposed oxide material 22. The lines 57 may inhibit the removal of underlying material, such that the material directly under the lines, such as the first mask 16, the columns 14, the polysilicon material 46, the substrate 30, the oxide material 22, etc., remains after removing material to form the second trench 62. In the word line end region 20, columns 15 including the oxide material 22 may remain between adjacent second trenches 62, as can be seen in FIG. 10.

The second trench 62 may be formed to have the depth $D_B$ in the word line end region 20 greater than or equal to the depth $D_A$ in the array region 10 by performing at least two material removal acts to form the second trench 62. As used herein, the phrase "at least two material removal acts" means and includes sequential material removal acts, e.g., etching acts, that have distinct chemistries and/or material removal conditions. The at least two material removal acts may comprise at least two anisotropic dry etching acts. By way of example and not limitation, a first material removal act may be performed in both the array region 10 and the word line end region 20 in the elongated regions 58. The first material removal act may partially form the second trench 62 by removing silicon of the polysilicon material 46 and of the silicon substrate 30 (including the first source/drain region 32, the mid-channel region 34, and the second source/drain region 36). Etchants that remove silicon may be chosen by one of ordinary skill in the art and are, therefore, not described in detail herein. A second material removal act may be performed in both the array region 10 and the word line end region 20 in the elongated regions 58. The second material removal act may further form the second trench 62 by removing oxide of the oxide material 22. Etchants that remove oxide may be chosen by one of ordinary skill in the art and are, therefore, not described in detail herein. The first material removal act and the second material removal act may each be controlled, such as in time, etch rate, chemistry, selectivity, etc., to remove a predetermined amount of material to tailor the depths $D_A$ and $D_B$ of the second trench 62 in the array region 10 and in the word line end region 20, respectively. The first and second material removal acts may be performed in situ, i.e., in a single machine, or ex situ, i.e., in more than one machine. Therefore, the at least two material removal acts may be used to form the second trench 62 having the depth $D_B$ in the word line end region 20 that is about equal to or greater than the depth $D_A$ in the array region 10.

Although the formation of the second trench 62 has been described with the first material removal act that removes silicon material followed by the second material removal act that removes oxide material, the present disclosure is not limited to this particular chemistry scheme and sequence. The same effect of removing material to form the second trench 62 with the depth $D_B$ in the word line end region 20 that is about equal to or greater than the depth $D_A$ in the array region 10 may be realized with other chemistries and/or sequences, as well. For example, in one embodiment, the material removal acts described above may be reversed in time such that a material removal act that removes oxide material is followed by a material removal act that removes silicon material. Similarly, in another embodiment, either of the first and the second material removal acts may be replaced by a material removal act that removes both silicon material and oxide material. In yet another embodiment, a third material removal act may be performed having a different chemistry than either of the first material removal act and the second material removal act described above. In other words, the at least two material removal acts may include any appropriate combination of two or more material removal acts to form the second trench 62 having the depth $D_B$ in the word line end region 20 that is about equal to or greater than the depth $D_A$ in the array region 10.

Furthermore, the present disclosure is not limited to forming the second trench 62 to have a depth $D_B$ in the word line end region 20 that is about equal to or greater than the depth $D_A$ in the array region 10. For example, in some embodiments, the depths $D_A$ and $D_B$ may be tailored such that the depth $D_B$ in the word line end region 20 is less than the depth $D_A$ in the array region 10.

Figure 11:
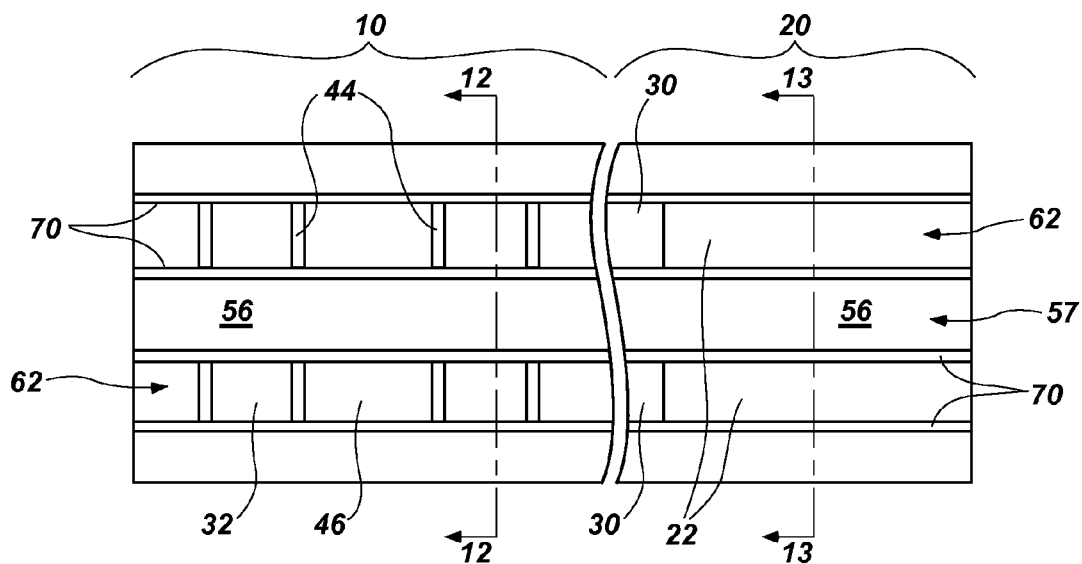

After the second trench 62 is formed, the semiconductor device structure may be cleaned to remove surface defects. The cleaning may be referred to as a "pre-gateox cleaning" because the cleaning may be performed in preparation for forming an oxide gate material over the mid-channel region 34 along the sidewalls of the second trench 62, as will be described in more detail below. By way of example and not limitation, the semiconductor device structure may be cleaned with at least one of a dilute hydrofluoric acid ("DHF") solution and an ammonium hydroxide, hydrogen peroxide, and water solution ("APM"). The cleaning agents of the pre-gateox cleaning may partially remove the oxide material 22 in the word line end region 20, as shown in FIG. 10. Such removal may cause the oxide material 22 to horizontally recess, which may cause the first mask 16 to overhang the oxide material 22 in the columns 15, as shown at reference numeral 68. FIGS. 11 through 13 illustrate the semiconductor device structure after further processing. FIG. 11 is a top view of the semiconductor device structure taken along lines 11-11 in FIGS. 12 and 13. FIG. 12 is a cross-sectional side view of the semiconductor device structure in the array region 10, taken along line 12-12 of FIG. 11. FIG. 13 is a cross-sectional side view of the semiconductor device structure in the word line end region 20, taken along line 13-13 of FIG. 11.

After the pre-gateox cleaning described above, an oxide gate material 64 may be formed in the second trench 62 at least along portions of the sidewalls of the columns 14 in the array region 10, as can be seen in FIG. 12. The oxide gate material 64 may be formed of an oxide material, e.g., $SiO_2$, as is known in the art, such as, for example, by a CVD process, an in situ steam generation ("ISSG") process, an ALD process, etc. Referring to FIGS. 11 through 13, word lines 70 may be formed in the second trench 62 along the sidewalls of the columns 14, 15 in both the array region 10 and in the word line end region 20. In the array region 10, the word lines 70 may be formed over the oxide gate material 64 and over the mid-channel region 34. In the word line end region 20, the word lines 70 may be formed over the oxide material 22 in the second trench 62. The second trench 62 may be referred to as a "word line trench" because the word lines 70 may be formed in the second trench 62.

The word lines 70 may be formed by, for example, depositing a conductive material over the semiconductor device structure. In one embodiment, the conductive material of the word lines 70 may include one or more of titanium nitride ("TiN"), tantalum nitride ("TaN"), tungsten, ruthenium, etc. The word lines 70 may be separated by, for example, conducting an anisotropic dry etching act that removes the conductive material of the word lines 70 from at least horizontal surfaces, such as from the bottom of the second trenches 62 and from over the second mask 56. Conductive material may remain on the sidewalls of the columns 14, 15 after such an anisotropic dry etching act. The anisotropic dry etching act may also vertically recess the conductive material of the word lines 70 from the second mask 56 in the array region 10, as shown in FIG. 12 by the recess distance $D_C$ between the top surface of the second mask 56 and the top of the word lines 70. The remaining word lines 70 in the array region 10 may substantially cover the mid-channel regions 34 and may optionally extend to or over at least portions of the first and second source/drain regions 32, 36, as illustrated in FIG. 12.

Referring now to FIG. 13 in conjunction with FIG. 12, while the word lines 70 in the array region 10 are vertically recessed the distance $D_C$ from the top surface of the column 14, the word lines 70 in the word line end region 20 may not be recessed as much from the second mask 56 as in the array region. In other words, a recess distance $D_D$ between the top surface of the second mask 56 and the top of the word lines 70 in the word line end region 20, when viewed in the perspective of FIG. 13, may be less than the recess distance $D_C$ in the array region 10. Thus, the tops of the word lines 70 may be closer to an upper surface of the semiconductor device (or a resulting vertical memory device or apparatus) in the word line end region 20 than in the array region 10. The recess distance $D_D$ in the word line end region 20 may be smaller due to a so-called "shadow effect" caused by the first mask 16 overhanging the conductive material of the word lines 70 in the word line end region 20, as shown at reference numeral 68 in FIG. 13. As described above, before the formation of the oxide gate material 64 and the conductive material of the word lines 70, the surfaces of the columns 14, 15 may be cleaned. Such a cleaning may include exposing the sidewalls of the columns 14, 15 to an aggressive cleaning agent, e.g., one or more of APM and DHF. The aggressive cleaning agent may react with the oxide material 22 in the word line end region 20 to horizontally recess the oxide material 22. However, the aggressive cleaning agent may not react as readily with the material of the first mask 16, such that the oxide material 22 is partially horizontally recessed from under the first mask 16. The overhanging first mask 16 may form a so-called "shadow" in the word line end region 20, which may at least partially inhibit vertical recessing of the conductive material of the word lines 70 during the anisotropic dry etching act that separates the word lines 70 and vertically recesses the word lines 70 in the array region 10. Therefore, the word lines 70 may extend further up the sidewalls of the columns 15 in the word line end region 20 than the columns 14 in the array region 10.

Figures 15, 16:
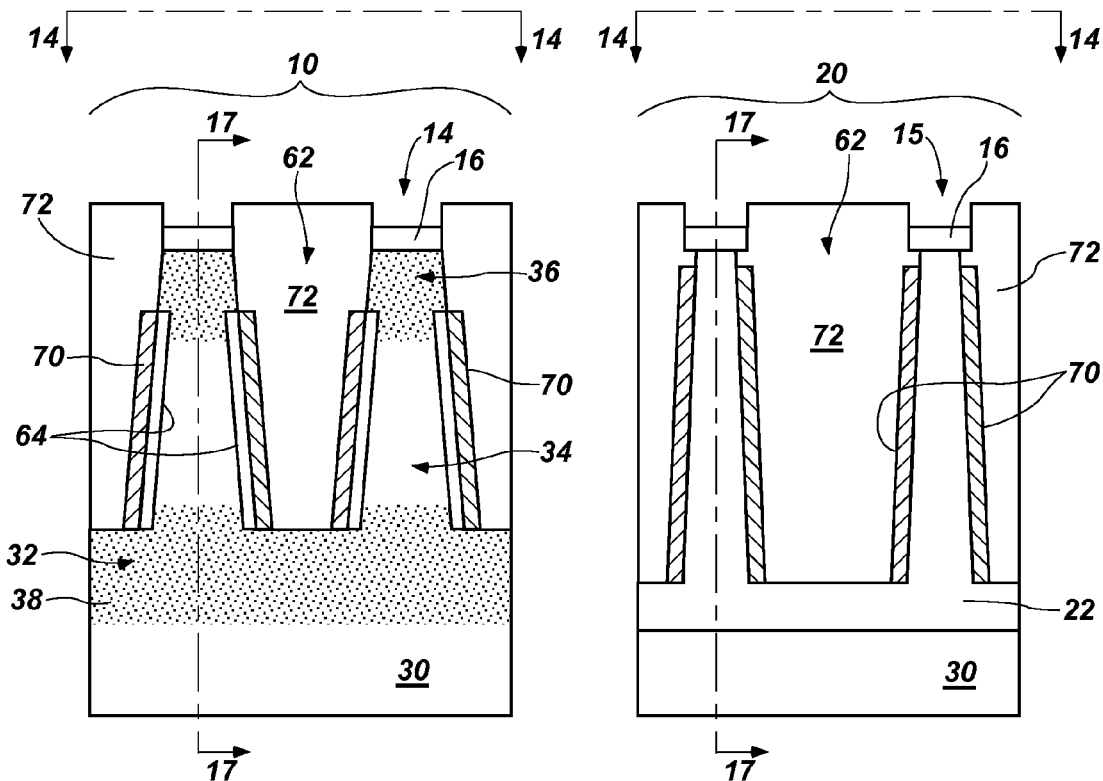
Figure 17:
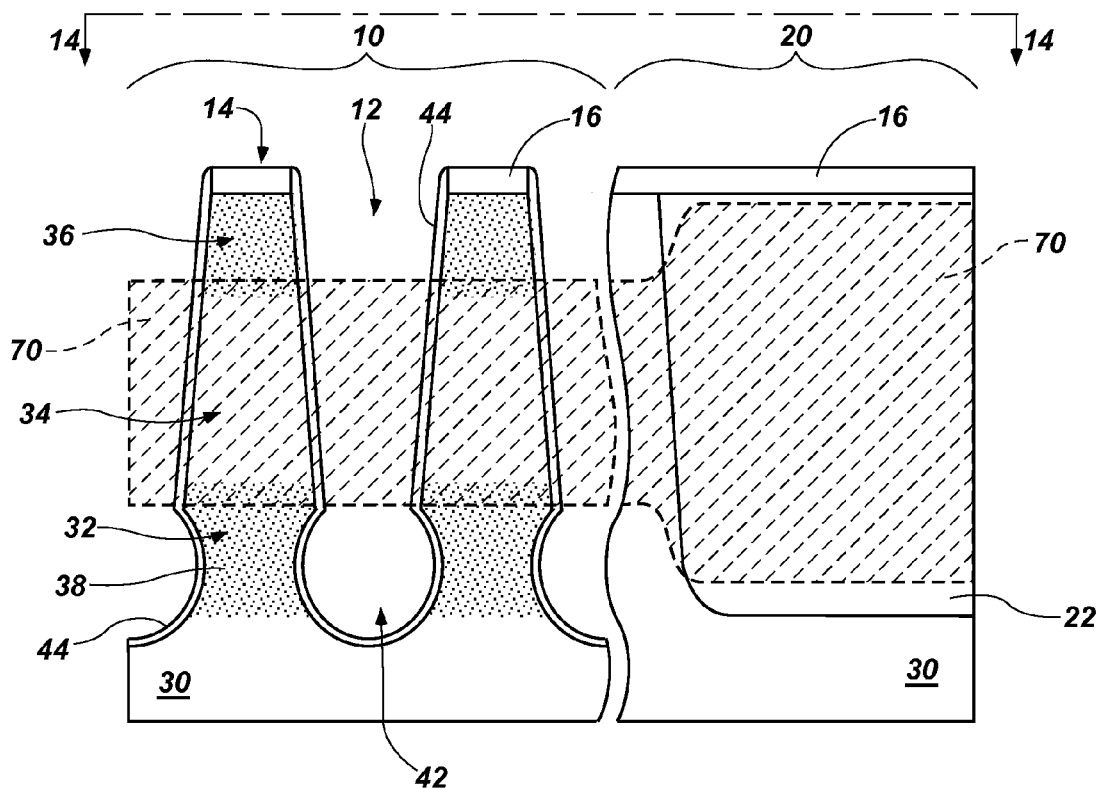

FIGS. 14 through 17 illustrate the semiconductor device structure after further processing. FIG. 14 is a top view of the semiconductor device structure taken along lines 14-14 in FIGS. 15 through 17. FIG. 15 is a cross-sectional side view of the array region 10 taken along line 15-15 in FIG. 14. FIG. 16 is a cross-sectional side view of the word line end region 20 taken along the line 16-16 in FIG. 14. FIG. 17 is a cross-sectional side view of the semiconductor device structure taken along lines 17-17 in FIGS. 14 through 16.

As illustrated in FIGS. 14 through 16, the second trenches 62 may be filled with a first dielectric material 72, such as, for example, an oxide material, e.g., $SiO_2$. The top of the first dielectric material 72 may be planarized by, for example, a CMP process that stops on the second mask 56 (see, e.g., FIGS. 11 through 13). The second mask 56 may then be removed by, for example, wet or dry etching, to expose the polysilicon material 46 in the first trench 12 (see, e.g., FIG. 7) and the first mask 16. As shown in FIG. 17, the polysilicon material 46 may then be removed from the first trench 12 and the isolation trench 42 by, for example, a wet etch that selectively removes the polysilicon material 46 while at least some of the first mask 16, the conformal liner 44, and the first dielectric material 72 remain. By way of example and not limitation, a suitable etchant that selectively removes the polysilicon material 46 in this manner may include tetramethylammonium hydroxide ("TMAH"). The word lines 70 are shown in FIGS. 14 and 17 in phantom to illustrate generally the location of the word lines 70 in the second trench 62 relative to the features in the array region 10 and in the word line end region 20.

Figure 18:
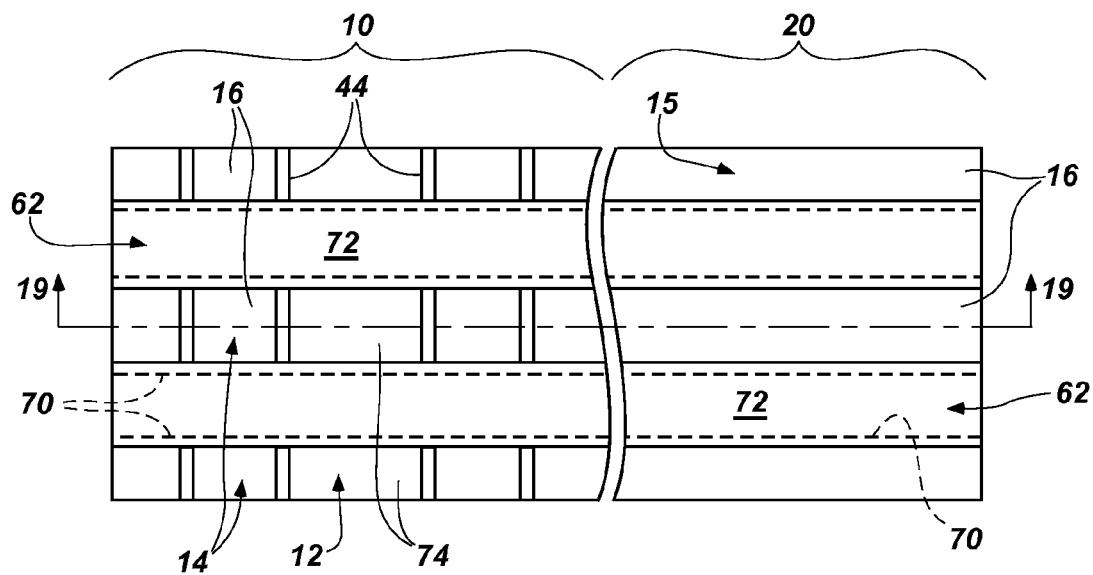
Figure 19:
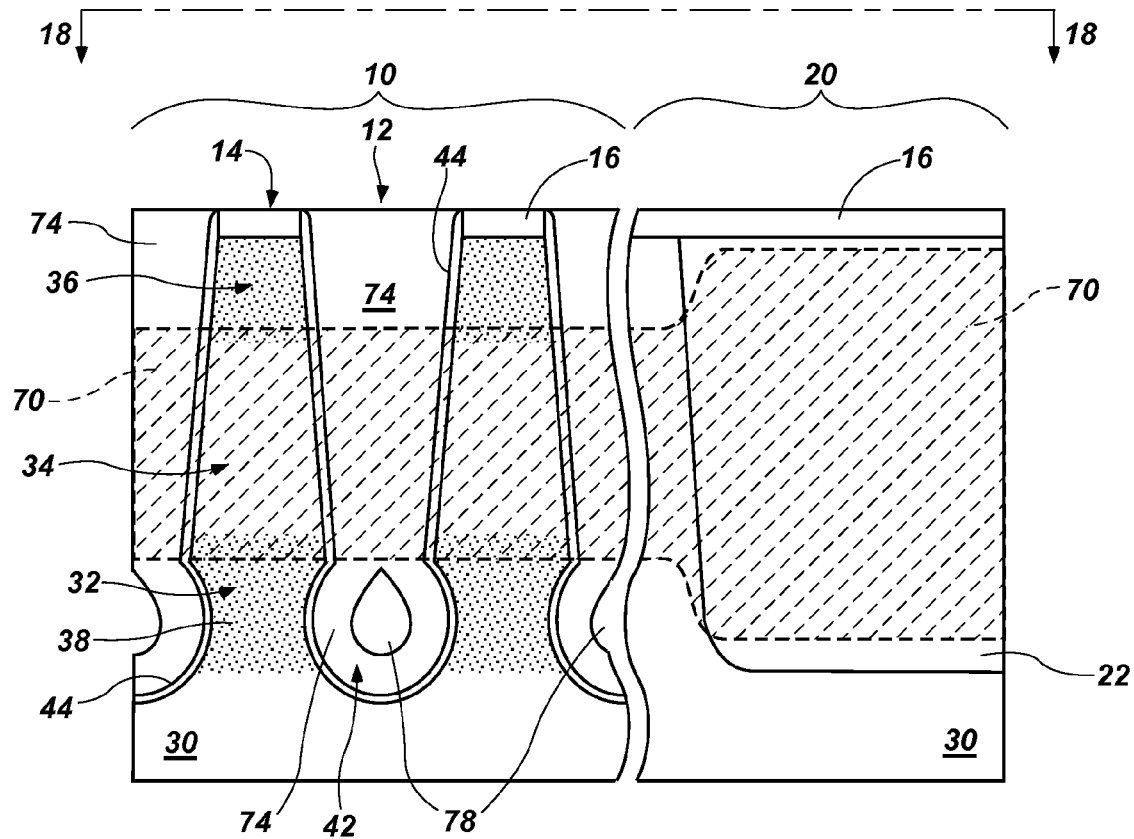

FIGS. 18 and 19 illustrate the semiconductor device structure after yet further processing. FIG. 18 is a top view of the intermediate semiconductor structure taken along lines 18-18 in FIG. 19. FIG. 19 is a cross-sectional side view of the semiconductor device structure taken along line 19-19 in FIG. 18.

As illustrated in FIGS. 18 and 19, the first trench 12 and the isolation trench 42 may be at least partially filled with a second dielectric material 74, such as, for example, an oxide material, such as SOD, $SiO_2$, a nitride material, such as SiN, etc. The second dielectric material 74 may physically and electrically isolate adjacent columns 14 in the first trench 12 and may physically and electrically isolate adjacent buried digit lines 38 in the isolation trench 42. The second dielectric material 74 may optionally be formed in the isolation trench 42 to define an airgap 78 therein for improved electrical isolation of the adjacent buried digit lines 38. If such an airgap 78 is desired, the second dielectric material 74 may be a dielectric material formed by, for example, a high density plasma ("HDP") process, a plasma-enhanced CVD ("PECVD") process, etc. In some embodiments, the second dielectric material 74 may be formed using more than one process. For example, the isolation trench 42 may first be filled with the second dielectric material 74 to form the airgap 78. Subsequently, the first trench 12 may be substantially filled with the second dielectric material 74 in a separate process. The word lines 70 are shown in FIGS. 18 and 19 in phantom to illustrate generally the location of the word lines 70 in the second trench 62 relative to the features in the array region 10 and in the word line end region 20. As can be seen in FIG. 19, the word lines 70 may have a greater vertical length in the word line end region 20 than in the array region 10. Each column 14 and the associated elements, such as the oxide gate material 64, the word line 70, etc., in the array region may form a transistor, e.g., a memory cell, for use in a memory array, a vertical memory device, and/or an apparatus.

Although the formation of the regions 32, 34, and 36 is described above as occurring before the formation of the mask 16 and the first trenches 12 (FIG. 1), the present disclosure is not so limited. For example, in alternative embodiments, the substrate 30 may be doped to form the first source/drain region 32 after the first trenches 12 and the sidewall liners 18 are formed. The substrate 30 may be doped to form the second source/drain region 36 after the word lines 70 are formed. Thus, the substrate may be doped to form one or more of the regions 32, 34, and 36 at any convenient time in the formation of a semiconductor device, as will be appreciated by one of ordinary skill in the art.

Accordingly, the present disclosure includes methods for forming a vertical memory device, including forming a plurality of first trenches in a silicon substrate extending in a first direction in an array region. The plurality of first trenches may be at least partially filled with a polysilicon material. A plurality of second trenches may be formed in the array region and in a word line end region extending in a second direction generally perpendicular to the first direction. Forming each second trench of the plurality of second trenches includes removing one of silicon and oxide from the array region and the word line end region with a first material removal act to partially form the second trench and by removing the other of silicon and oxide from the array region and the word line end region with a second material removal act to form the second trench. Forming the second trench may, in some embodiments, further include forming the plurality of second trenches having a depth in the word line end region greater than or equal to a depth thereof in the array region. The method may further include anisotropically etching conductive material formed in the plurality of second trenches to form a first and a second word line on opposing sidewalls defining each second trench. Additionally, before forming the conductive material in the second trench, surfaces of the second trench may be cleaned with APM and/or DHF and an oxide gate material may be formed on at least portions of the sidewalls defining the plurality of second trenches.

In addition, the present disclosure includes methods of forming an apparatus including sidewall word lines, the method including removing a portion of silicon material from a silicon substrate to form a plurality of isolation trenches in an array region that each extend in a first direction and separate adjacent buried digit lines. The isolation trenches are at least partially filled with a polysilicon material. The methods further include removing another portion of silicon material from the silicon substrate in the array region, a portion of the polysilicon material in the array region, and a portion of an oxide material in a word line end region to form a plurality of word line trenches in the array region and the word line end region, each extending in a second direction generally perpendicular to the first direction. Forming the plurality of word line trenches includes foaming each word line trench of the plurality to have a depth in the word line end region about equal to or greater than a depth thereof in the array region. A plurality of word lines are formed in the word line trenches. Forming the plurality of word lines includes forming a conductive material in the word line trenches and removing a portion of the conductive material to separate adjacent word lines within each word line trench, the word lines each extending along a sidewall defining the word line trench of the plurality.

The method described above with reference to FIGS. 1 through 17 may provide improved manufacturing and device performance when compared to conventional methods of forming a vertical memory device. As described above, the method of the present disclosure includes at least partially filling the first trench 12 and the isolation trench 42 with the polysilicon material 46. Because material in the columns 14, the first trench 12, and the isolation trench 42 includes silicon, the etch rates of the columns 14 and the polysilicon material 46 in the trenches 12, 42 are more uniform than in a conventional configuration that includes an oxide material in the first trench. The sidewalls defining the second trenches 62 may have a substantially uniform slope, i.e., angle from vertical, because the material being removed to form the second trenches 62 is predominantly silicon. The substantial uniformity of the etch rates and slope in the array region 10 may enable the formation of the second trenches 62 defined by substantially planar sidewalls and substantially planar bottoms. The substantially planar sidewalls and bottoms may ease difficulties in forming the word lines 70 in the second trenches 62.

The methods of the present disclosure may also enable a more aggressive pre-gateox clean than is practical using conventional methods. For example, filling the first trench 12 with the polysilicon material 46 may reduce or eliminate problems of conventional methods associated with aggressively cleaning the semiconductor device structure. The polysilicon material 46 of the present disclosure may, therefore, enable the aggressive cleaning, e.g., with APM and/or DHF, to remove defects more effectively than water alone, while maintaining substantially planar sidewalls of the second trench 62 and forming a substantially uniformly shaped word line 70 in the array region 10.

Furthermore, the so-called "shadow effect" caused by the cleaning with APM and/or DHF that may be present in the word line end region 20 of the present disclosure, as described above with reference to FIGS. 10 and 13, may improve the connection of a word line contact (not shown) to the word line 70 in the word line end region 20. The tops of adjacent word lines 70 on either side of each column 15 in the word line array region 20 may be closer to each other due to the slope of the sidewalls defining the second trench 62 compared to tops of adjacent word lines 70 that are vertically recessed to a greater extent. A word line contact (not shown) may subsequently be formed over each column 15 in the word line end region 20 to electrically contact adjacent word lines 70 on either side of each column 15. When the tops of the adjacent word lines 70 on either side of the column 15 are relatively closer to each other, the word line contact may be relatively smaller, e.g., have a reduced aspect ratio, potentially saving space and/or contact material and widening the acceptable tolerance for forming the word line contact. In addition, the horizontal recessing of the oxide material 22 of the columns 15 in the word line end region 20 may also occur along the sidewalls of the second trench 62 in a lower portion thereof, i.e., near the bottom of the second trench 62. Such horizontal recessing may provide a greater distance between adjacent word lines 70 on either side of each second trench 62 for improved physical and electrical isolation between the adjacent word lines 70 on either side of each second trench 62. Therefore, the methods of the present disclosure may bring adjacent word lines 70 on either side of each column 15 closer together to provide a smaller contact area while simultaneously providing a wider gap between adjacent word lines 70 on either side of each second trench 62 for improved electrical isolation thereof.

Additionally, the present disclosure encompasses a memory array. Although the semiconductor device structure shown in the figures is described above as including the array region 10 and the word line end region 20, the phrase "memory array" may include one or more elements positioned in one or both of the array region 10 and the word line end region 20.

With reference to FIGS. 15, 16, 18, and 19, a memory array of the present disclosure may include a plurality of vertical columns 14 in the array region 10 each including the first source/drain region 32, the mid-channel region 34, and the second source/drain region 36. Each column 14 may be or form a part of a so-called "vertical transistor." The first and second source/drain regions 32, 36 may each be doped differently than the mid-channel region 34 to form a pn-junction at an interface between the first source/drain region 32 and the mid-channel region 34 and between the second source/drain region 36 and the mid-channel region 34. The first source/drain region 32 may horizontally extend in a first direction (e.g., to the left and right in FIG. 15, up and down in FIG. 18, into and out of the page in FIG. 19) at least partially through a plurality of columns 14. In other words, the buried digit line 38 including the first source/drain regions 32 of a plurality of columns 14 may extend in the first direction. The first and second dielectric materials 72, 74 may be disposed between adjacent columns 14 in the array region 10, as shown in FIGS. 15 and 18. The first dielectric material 72 may be disposed between adjacent columns 15 in the word line end region 20, as shown in FIG. 16.

A plurality of word lines 70 may each horizontally extend in a second direction generally perpendicular to the first direction along sidewalls of the columns 14 in the array region 10 and along sidewalls of the columns 15 in the word line end region 20, as can be seen in FIGS. 15, 16, 18, and 19. In the array region 10, the word lines 70 may each vertically extend to substantially cover the mid-channel regions 34 of the columns 14. As can be seen in FIG. 19, each word line 70 in the word line end region 20 may have a depth in the word line end region 20 about equal to or greater than a depth thereof in the array region 10. Furthermore, each word line 70 in the array region 10 may be vertically recessed from an upper surface of the columns 14 more than the word line 70 is recessed from an upper surface of the columns 15 in the word line end region 20. Stated another way, each word line 70 may be closer to an upper surface of the memory array in the word line end region 20 higher than in the array region 10 and may vertically extend in the word line end region 20 to a depth in the word line end region 20 about equal to or greater than in the array region 10.

Figure 20:
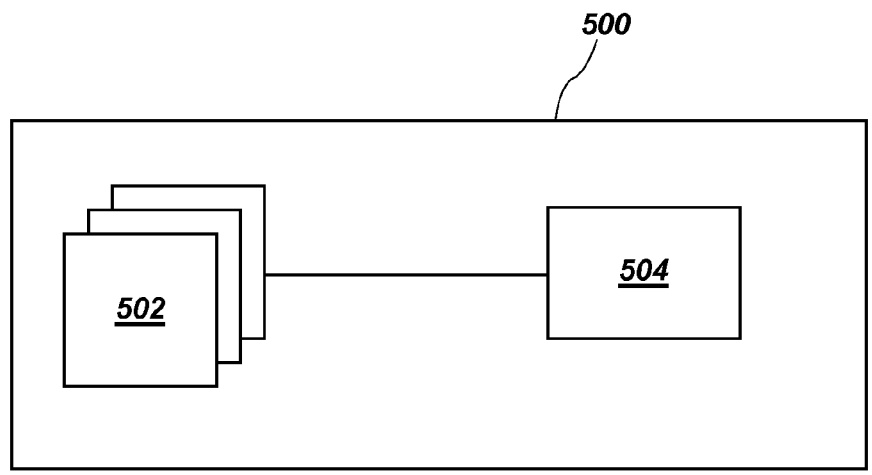
FIG. 20 is a simplified block diagram of a memory device including a memory array formed according to one or more embodiments described herein.

With reference to FIG. 20, illustrated is a simplified block diagram of a memory device 500 implemented according to one or more embodiments described herein. The memory device 500 includes a memory array 502 and a control logic component 504. The memory array 502 may include a plurality of vertical transistors and word lines 70, as described above. The control logic component 504 may be configured to operatively interact with the memory array 502 so as to read, write, or refresh any or all vertical transistors within the memory array 502.

Accordingly, a memory device comprising a vertical transistor array, e.g., a vertical memory device, is disclosed. The vertical transistor array comprises a plurality of vertical transistors and a plurality of word lines. Each word line of the plurality is formed on sidewalls of a trench and has a depth in the word line end region about equal to or greater than a depth thereof in the array region.

Figure 21:
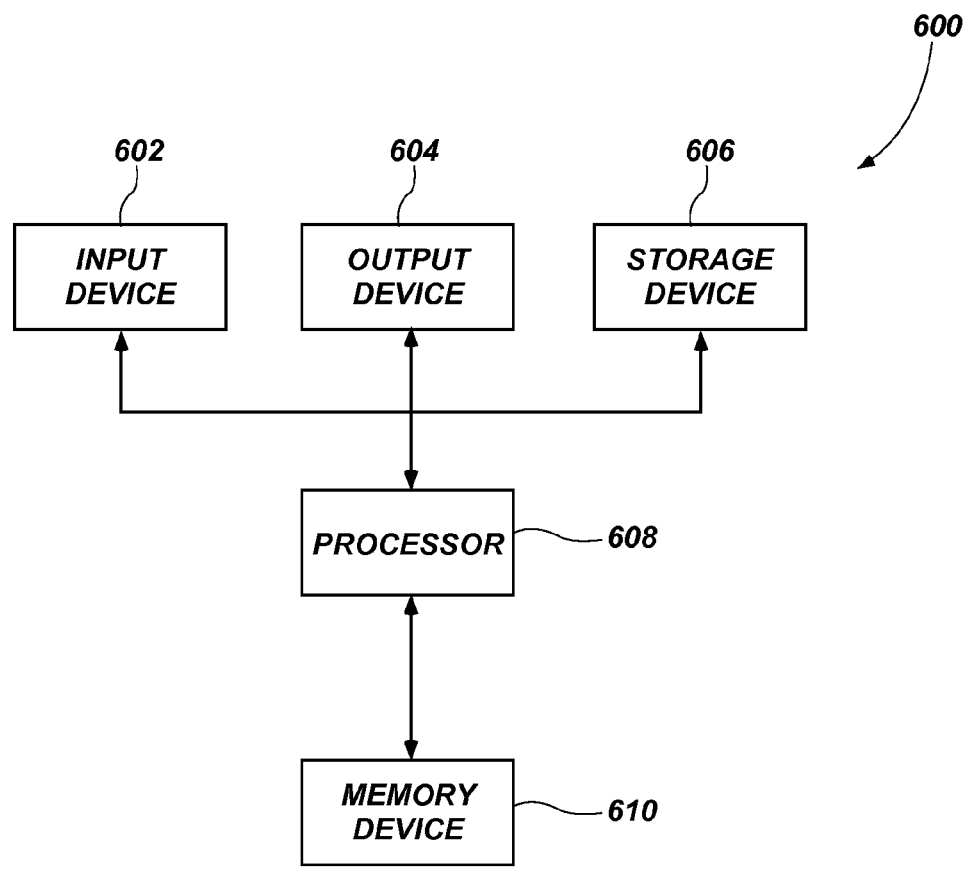
FIG. 21 is a simplified block diagram of a system implemented according to one or more embodiments described herein.

With reference to FIG. 21, illustrated is a simplified block diagram of a system 600 implemented according to one or more embodiments described herein. The system 600 includes at least one input device 602. The input device 602 may be a keyboard, a mouse, or a touch screen. The system 600 further includes at least one output device 604. The output device 604 may be a monitor, touch screen, or speaker, for example. The input device 602 and the output device 604 are not necessarily separable from one another. The system 600 further includes a storage device 606. The input device 602, output device 604, and storage device 606 are coupled to a conventional processor 608. The system 600 further includes a memory device 610 coupled to the processor 608. The memory device 610 includes at least one vertical transistor array, such as a memory array according to one or more embodiments described herein. The system 600 may be incorporated within a computing, processing, industrial, or consumer product. For example, without limitation, the system 600 may be included within a personal computer, a handheld device, a camera, a phone, a wireless device, a display, a chip set, a game, a vehicle, or other known systems.

Accordingly, a system is disclosed comprising a memory array comprising a plurality of vertical transistors in an array region and a plurality of word lines extending horizontally along sidewalls in the array region and in a word line end region. Each word line has a depth in the word line end region about equal to or greater than a depth thereof in the array region.

An apparatus, such as a memory device 500 or a system 600 including a memory device 610, is also disclosed including a plurality of vertical transistors in an array region and a plurality of word lines extending horizontally along sidewalls in the array region and in a word line end region. Each word line of the plurality of word lines may have a depth in the word line end region about equal to or greater than a depth thereof in the array region. Each word line may also have a top that is closer to an upper surface of the apparatus in the word line end region than in the array region.

Accordingly, the present disclosure includes an apparatus having sidewall word lines, the apparatus including a plurality of vertical transistors in an array region, a plurality of buried digit lines extending in a first direction and comprising source or drain regions of at least some of the vertical transistors, and a plurality of word lines. Each word line of the plurality extends in a second direction generally perpendicular to the first direction, is formed over at least a portion of a sidewall of at least some of the vertical transistors, and has a depth in the word line end region about equal to or greater than a depth thereof in the array region.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is encompasses all modifications, combinations, equivalents, and alternatives falling within the scope of the invention as defined by the following appended claims and their legal equivalents.

What is claimed is:

1. A method for forming a vertical memory device, the method comprising:
    forming a plurality of first trenches in a silicon substrate, the plurality of first trenches extending horizontally in a first direction in an array region of the vertical memory device;
    at least partially filling the plurality of first trenches with a polysilicon material;
    forming a plurality of second trenches in the array region and in a word line end region, the plurality of second trenches extending horizontally in a second direction perpendicular to the first direction, wherein forming each second trench of the plurality of second trenches comprises:
removing one of a silicon material of the silicon substrate in the array region and an oxide material of the word line end region with a first material removal act to partially form the second trench; and
removing the other of the silicon material of the silicon substrate in the array region and the oxide material of the word line end region with a second material removal act different than the first material removal act to complete the second trench.

2. The method of claim 1, wherein forming a plurality of second trenches comprises forming a plurality of second trenches having a depth in the word line end region greater than or equal to a depth thereof in the array region.

3. The method of claim 1, further comprising:
forming a conductive material in the plurality of second trenches;
anisotropically etching the conductive material in the plurality of second trenches to form in each second trench of the plurality of second trenches a first word line on a first sidewall defining the second trench and a second word line on a second sidewall defining the second trench, the second sidewall opposite the first sidewall and the first word line not contacting the second word line in the second trench.

4. The method of claim 3, further comprising:
cleaning surfaces of the plurality of second trenches with at least one of a dilute hydrofluoric acid solution and an ammonium hydroxide, hydrogen peroxide, and water solution; and
forming an oxide gate material on at least portions of the sidewalls defining the plurality of second trenches before forming the conductive material in the plurality of second trenches.

5. The method of claim 1, wherein at least partially filling the plurality of first trenches with a polysilicon material comprises completely filling the plurality of first trenches with the polysilicon material.

6. A method for forming an apparatus including sidewall word lines, the method comprising:
removing a portion of silicon material from a silicon substrate to form a plurality of isolation trenches in an array region of an apparatus, each isolation trench of the plurality of isolation trenches extending horizontally in a first direction and separating adjacent buried digit lines;
at least partially filling each isolation trench of the plurality of isolation trenches with a polysilicon material;
removing another portion of silicon material from the silicon substrate in the array region, a portion of the polysilicon material in the array region, and a portion of an oxide material in a word line end region of the apparatus to form a plurality of word line trenches, such that each word line trench of the plurality of word line trenches extends horizontally in the array region and in the word line end region in a second direction perpendicular to the first direction and has a depth in the word line end region greater than or equal to a depth thereof in the array region; and
forming a plurality of word lines in the word line trenches, comprising:
forming a conductive material in each word line trench of the plurality of word line trenches; and
removing a portion of the conductive material to separate adjacent word lines within each word line trench of the plurality of word line trenches, the word lines each extending along a sidewall defining the word line trench of the plurality of word line trenches.

7. The method of claim 6, further comprising:
removing the polysilicon material from the plurality of isolation trenches; and
at least partially filling the plurality of isolation trenches with a dielectric material.

8. The method of claim 7, wherein at least partially filling the plurality of isolation trenches with a dielectric material comprises forming an airgap in the dielectric material disposed between adjacent buried digit lines.

9. The method of claim 6, further comprising forming an oxide gate material on at least portions of the sidewalls defining the word line trenches in the array region before forming the plurality of word lines.

10. The method of claim 6, wherein forming the plurality of word line trenches comprises:
performing a first material removal act to remove silicon from the silicon substrate and the polysilicon material in the array region; and
performing a second material removal act to remove oxide from the oxide material in the word line end region.

11. The method of claim 6, wherein forming the plurality of word line trenches comprises:
performing a material removal act to remove one of silicon from the silicon substrate and the polysilicon material in the array region and oxide from the oxide material in the word line end region; and
performing another material removal act to remove both silicon from the silicon substrate and the polysilicon material in the array region and oxide from the oxide material in the word line end region.

12. The method of claim 6, wherein removing a portion of the conductive material comprises vertically recessing the conductive material in the array region.

13. The method of claim 12, further comprising:
horizontally recessing an oxide material on the sidewalls defining the plurality of word line trenches in the word line end region to cause a mask over the oxide material to overhang the oxide material; and
at least partially inhibiting vertical recessing of each word line of the plurality of word lines in the word line end region with the overhanging mask while vertically recessing the conductive material in the array region.

14. The method of claim 6, further comprising at least partially filling the plurality of word line trenches with a dielectric material.

* * * * *